(12) United States Patent
Otterstedt et al.

(10) Patent No.: US 8,125,821 B2
(45) Date of Patent: Feb. 28, 2012

(54) METHOD OF OPERATING PHASE-CHANGE MEMORY

(75) Inventors: Jan Otterstedt, Unterhaching (DE); Thomas Nirschl, Essex Junction, VT (US); Christian Peters, Vaterstetten (DE); Michael Bollu, Kirchheim (DE); Wolf Allers, Munich (DE); Michael Sommer, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 24 days.

(21) Appl. No.: 11/756,639

(22) Filed: Jun. 1, 2007

(65) Prior Publication Data
US 2008/0298121 A1 Dec. 4, 2008

(51) Int. Cl.
*G11C 11/00* (2006.01)
(52) U.S. Cl. ........................................ 365/163; 365/148

(58) Field of Classification Search .................. 365/148, 365/163, 46, 94, 100, 113, 129; 257/2–5, 257/296, E31.047, E27.006; 438/95, 96, 438/365, 29, 166, 259, 482, 486, 597; 977/754
See application file for complete search history.

(56) References Cited

U.S. PATENT DOCUMENTS
4,646,266 A * 2/1987 Ovshinsky et al. ........... 365/105
(Continued)

FOREIGN PATENT DOCUMENTS
DE 102004051152 A1 5/2006
(Continued)

*Primary Examiner* — Richard Elms
*Assistant Examiner* — Harry W Byrne
(74) *Attorney, Agent, or Firm* — Infineon Technologies; Philip Schlazer

(57) ABSTRACT

One or more embodiments are related to a method of operating a phase-change memory array, including: providing the phase-change memory array, the phase-change memory array including a phase-change memory element in series with an access device between a first address line and a power line; causing a first current through the memory element from the first address line to the power line; and causing a second current through the memory element from the power line to the first address line.

18 Claims, 6 Drawing Sheets

U.S. PATENT DOCUMENTS

| | | | |
|---|---|---|---|
| 5,166,758 A * | 11/1992 | Ovshinsky et al. | 257/3 |
| 6,590,807 B2 * | 7/2003 | Lowrey | 365/175 |
| 6,795,338 B2 * | 9/2004 | Parkinson et al. | 365/163 |
| 7,453,715 B2 * | 11/2008 | Parkinson | 365/148 |
| 7,460,389 B2 * | 12/2008 | Hsu et al. | 365/113 |
| 7,890,892 B2 | 2/2011 | Brosse et al. | |
| 2004/0202017 A1 * | 10/2004 | Lee | 365/163 |
| 2006/0073631 A1 * | 4/2006 | Karpov et al. | 438/102 |
| 2006/0097240 A1 * | 5/2006 | Lowrey et al. | 257/5 |
| 2006/0097343 A1 * | 5/2006 | Parkinson | 257/528 |
| 2006/0171194 A1 * | 8/2006 | Lowrey et al. | 365/154 |
| 2007/0242496 A1 | 10/2007 | Hoffmann et al. | |
| 2008/0084734 A1 | 4/2008 | De Brosse et al. | |
| 2009/0027943 A1 | 1/2009 | Nirschl et al. | |

FOREIGN PATENT DOCUMENTS

WO       WO 9705665 A1 *    2/1997

* cited by examiner

METHOD OF OPERATING PHASE-CHANGE MEMORY

FIELD OF THE INVENTION

The present invention relates generally to electrically programmable memory. More particularly, the present invention relates to phase-change memory.

BACKGROUND OF THE INVENTION

Programmable resistance memory elements formed from materials that can be programmed to exhibit at least a high or low stable ohmic state are known in the art. Such programmable resistance elements may be programmed to a high resistance state to store, for example, a logic ONE data bit or programmed to a low resistance state to store a logic ZERO data bit.

One type of material that can be used as the memory material for programmable resistance elements is phase-change material. Phase-change materials may be programmed between a first structural state where the material is generally more amorphous (less ordered) and a second structural state where the material is generally more crystalline (more ordered).

A volume of phase-change material may be programmed between a more ordered, low resistance state and a less ordered, high resistance state. A volume of phase-change material is capable of being transformed from a high resistance state to a low resistance state in response to the input of a single pulse of energy referred to as a "set pulse". The set pulse is sufficient to transform the volume of memory material from the high resistance state to the low resistance state. It is believed that application of a set pulse to the volume of memory material changes the local order of at least a portion of the volume of memory material. Specifically, it is believed that the set pulse is sufficient to change at least a portion of the volume of memory material from a less-ordered amorphous state to a more-ordered crystalline state.

The volume of memory material is also capable of being transformed from the low resistance state to the high resistance state in response to the input of a single pulse of energy which is referred to as a "reset pulse". The reset pulse is sufficient to transform the volume of memory material from the low resistance state to the high resistance state. While not wishing to be bound by theory, it is believed that application of a reset pulse to the volume of memory material changes the local order of at least a portion of the volume of memory material. Specifically, it is believed that the reset pulse is sufficient to change at least a portion of the volume of memory material from a more-ordered crystalline state to a less-ordered amorphous state.

SUMMARY OF THE INVENTION

An embodiment of the invention is a method of operating a phase-change memory array, comprising: providing the phase-change memory array, the phase-change memory array comprising a phase-change memory element in series with an access device between a first address line and a power line; causing a first current through the memory element from the first address line to the power line; and causing a second current through the memory element from the power line to the first address line.

Another embodiment of the invention is a method of operating a phase-change memory array, comprising: providing the memory array, the array including a phase-change memory element having a first terminal and a second terminal; causing a first current through the memory element from the first terminal to the second terminal; and causing a second current through the memory element from the second terminal to the first terminal.

Another embodiment of the invention is a method of operating a phase-change memory array, comprising: providing the memory array, the array including a phase-change memory element electrically coupled between a first address line and a second address line; causing a first current to flow from the first address line to the second address line through the memory element; and causing a second current to flow from the second address line to the first address line.

Another embodiment of the invention is a memory system, comprising: a memory array including a phase-change memory element electrically coupled between a first address line and a second address line; and a write control circuit for controlling the voltage levels of the first address line and the second address line when writing to the memory element, the circuit causing the first address line and the second address line to have first voltage levels during one or more first-type write operations so that current flows through the memory element from the first address line to the second address line, the circuit causing the first address line and second address line to have second voltage levels during one or more second-type write operations so that current flows through the memory element from the second address line to the first address line.

Another embodiment of the invention is a memory system, comprising: a memory array including a phase-change memory element in series with an access device between a first address line and a power line; and a write control circuit for controlling the voltage level of the first address line and the power line when writing to the memory element, the circuit causing the first address line and the power line to have first voltage levels during one or more first-type write operations so that current flows through the memory element from the first address line to the power line, the circuit causing the first address line and the power line to have second voltage levels during one or more second-type write operations so that current flows through the memory element from power line to the first address line.

Another embodiment of the invention is a memory system, comprising: a memory array including a phase-change memory element electrically coupled between a first address line and a second address line; and a read control circuit for controlling the voltage levels of the first address line and the second address line when reading the memory element, the circuit causing the first address line and the second address line to have first voltage levels during one or more first-type read operations so that current flows through the memory element from the first address line to the second address line, the circuit causing the first address line and second address line to have second voltage levels during one or more second-type read operations so that current flows through the memory element from the second address line to the first address line.

Another embodiment of the invention is a memory system, comprising: a memory array including a phase-change memory element in series with an access device between a first address line and a power line; and a read control circuit for controlling the voltage level of the first address line and the power line when reading the memory element, the circuit causing the first address line and the power line to have first voltage levels during one or more first-type read operations so that current flows through the memory element from the first address line to the power line, the circuit causing the first address line and the power line to have second voltage levels during one or more second-type read operations so that current flows through the memory element from power line to the first address line.

DETAILED DESCRIPTION OF THE INVENTION

The present invention relates to phase-change memory. Each of the phase-change memory elements is programmable to at least a first resistance state and a second resistance state. The phase-change memory elements may be arranged in one or more memory arrays. The phase-change memory material may be a chalcogenide material.

Figure 1:
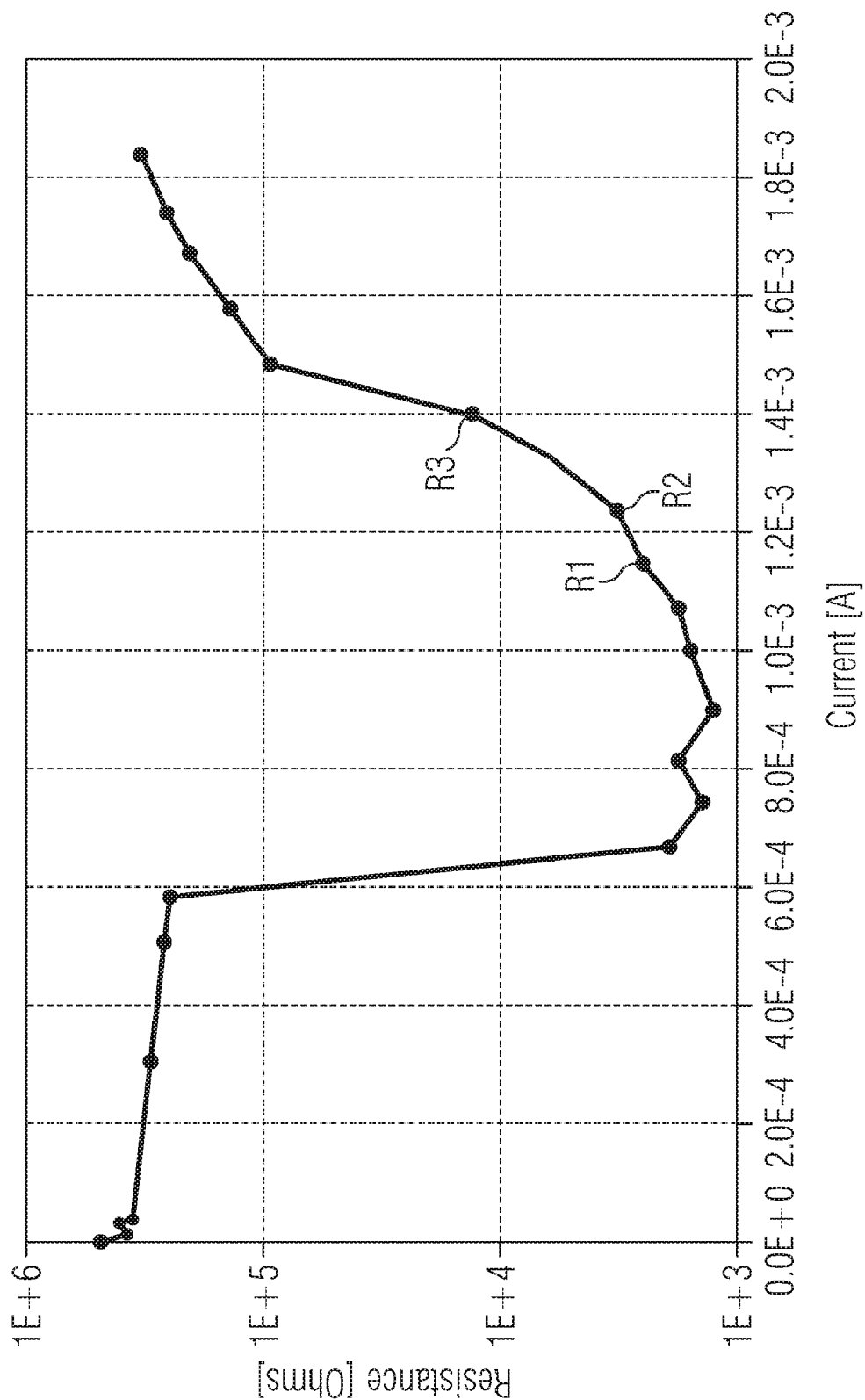
FIG. 1 is an example of a current-resistance curve of a embodiment of a chalcogenide phase-change element.

FIG. 1 is an example of a plot of the resistance of a chalcogenide phase-change element versus the amplitude of a current pulse through the phase-change element. Referring to FIG. 1, several different programming regimes can be distinguished. In the left side of the curve, the resistance of the phase-change element remains substantially constant in an amorphous high-resistance RESET state. The device remains in its RESET state until sufficient energy is applied to the device. The phase-change element is then transformed from its high resistance RESET state to its crystalline low resistance SET state. The current pulse sufficient to program the phase-change element from the high resistance state to the low resistance state is referred to as a "set pulse". While not wishing to be bound by theory, it is believed that the set pulse is sufficient to change at least a portion of the phase-change material from a less-ordered amorphous state to a more-ordered crystalline state.

The phase-change element may be programmed from the low resistance SET state to the high resistance RESET state by applying a current pulse of sufficient amplitude, referred to as a "reset pulse". While not wishing to be bound by theory, it is believed that application of a reset pulse to the phase-change element is sufficient to change at least a portion of the phase-change material from a more-ordered crystalline state to a less-ordered amorphous state.

The phase-change element may be programmed back and forth between the high resistance RESET state and the low resistance SET state. This type of programming scheme provides for a binary mode of operation (for example, the RESET state may be a logic 0 while the SET state may be a logic 1).

Referring to the right side of the curve of FIG. 1, as the amplitude of the current through the phase-change element increases, the resistance of the element increases. This increase is both gradual and reversible. In this regime, the chalcogenide phase-change element may be programmed to any resistance value within a window of resistance values bounded by the low resistance SET state and the high resistance RESET state. More specifically, in this regime along the right side of the curve, the phase-change element may be programmed from any one of the resistance states on the right side of the resistance curve to any other of the resistance states on the right side of the curve by the application of a current pulse of sufficient amplitude. The phase-change element may be programmed among three or more resistance values within the resistance window so as to provide for a multi-bit data storage. The multi-bit data storage may be directly overwritable. While not wishing to be bound by theory, it is believed that each of the resistance states along the right side of the curve may correspond to a particular ratio of crystalline material to amorphous material in an active region of the chalcogenide material. Examples of three intermediate resistance states R1, R2 and R3 are shown in the resistance curve of FIG. 1.

Figure 2:
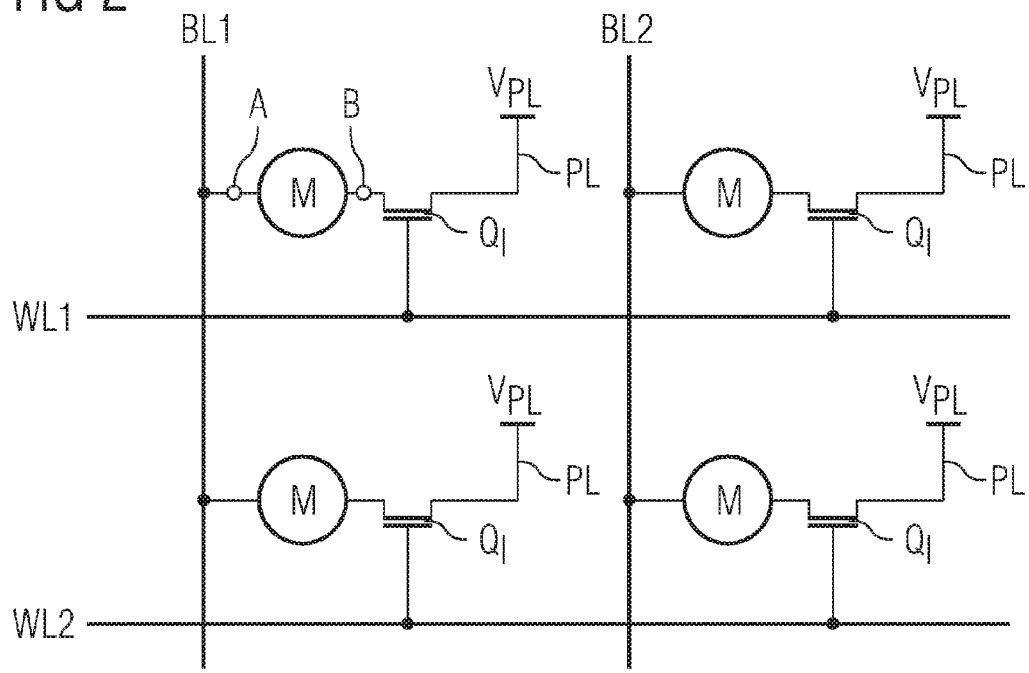
FIG. 2 is an embodiment of a memory array of the present invention.

FIG. 2 shows an embodiment of a memory array of the present invention. FIG. 2 shows a two by two memory array that includes two bitlines BL1, BL2 (also referred to in the art as column lines) and two wordlines WL1, WL2 (also referred to in the art as row lines). In the embodiment shown, each bitline is associated with a particular column of the memory array and each wordline is associated with a particular row of the array. The memory array further includes four memory cells. Each memory cell includes a memory element M coupled in series with an n-channel MOS transistor $Q_I$. The memory cell is electrically coupled in series between a corresponding bitline BL1, BL2 and a power line PL. In other embodiments of the invention, the memory array may have at least one row of memory elements and at least one column of memory elements. In other embodiments of the invention, the memory array may have at least two rows of memory elements and at least two columns of memory elements. Each column of memory elements has an associated bitline. Likewise, each row of memory elements has an associated wordline. In the embodiment shown in FIG. 2, each memory element M is addressed by a single bitline and a single wordline. In other embodiments of the invention, it is possible that more than one bitline and/or more that one word line can be used to address each of the memory elements.

The NMOS transistors $Q_I$ serves as isolation devices for the array that isolates the memory elements so that each of the memory elements may be written to or read from without affecting other memory elements. The isolation devices may also be referred to in the art as steering devices or select devices. Other forms of isolation devices are possible such as, for example, PMOS transistors, bipolar transistors, other forms of transistors, diodes, and threshold switches (such as chalcogenide threshold switches). In the embodiment shown in FIG. 2, the NMOS transistor may be replaced with a controllable interconnect device that includes a control terminal that can control the current flow between two other terminals.

In the embodiment shown, the power line PL is distinct from either the bitlines or the wordlines. In one or more embodiments of the invention, the power line is not an address line. In the embodiment shown in FIG. 2, each of the transistors $Q_I$ is coupled to a common power line PL.

In the embodiment shown in FIG. 2, each memory element M is coupled in series with an isolation device $Q_I$ between a bitline and the power line. In the embodiment shown in FIG. 2, the power line PL is coupled to the source or drain of each of the isolation transistors $Q_I$. The power line PL is selectively coupled to the bitline through the memory element and through the current pathway of the isolation transistor $Q_I$. When the isolation transistor $Q_I$ is turned off, there is no current flow through the memory element M. However, when the isolation transistor is turned on, the power line PL is coupled to the bitline through the memory element and current pathway of the transistor. If the voltage on the bitline is different from that of the power line, there will be a potential difference across the memory element and current will flow through the memory element. If the voltage on the bitline is greater than the voltage on the power line, then current will flow through the memory element in a direction from the bitline to the power line (in a direction from first terminal A to second terminal B in FIG. 2). However, if the voltage on the power line is greater than the voltage that is on the bitline, then current will flow through the memory element in a direction from the power line to the bitline (in a direction from second terminal B to first terminal A).

Hence, the voltages may be applied to the bitlines as well as to the power line so that during one or more write operations the current through the memory element is directed in a first direction, such as from the power line PL to the bitline (either BL1 or BL2). Likewise, the voltages may also be applied to the bitlines as well as to the power line so that during one or more write operations the current through the memory element is directed through the memory in a second direction, such as from the bitline to the power line PL. Write operations include, for example, operations to program the device or either the SET state or the RESET state. Write operation also include, for example, operations to program the device to any resistance state on the right side of the R-I curve shown in FIG. 1. A write operation may, for example, program the device to a state which is different from the previous state (for example, a SET operation followed by a RESET operation or s RESET operation followed by a SET operation). A write operation, may, for example, program the device to a state which is the same as the previous state (for example, a SET operation followed by a SET operation or a RESET operation followed by a RESET operation).

The write operations where the current is directed in a first direction through the memory element are referred to herein as first-type write operations (or first-type writes). Write operations where the current is directed in a second direction (e.g. opposite to the first direction) are referred to a second-type write operations (or second-type writes).

Many different operating schemes are possible. For example, in one or more embodiments of the invention, a certain number N1 of first-type writes may be followed by a certain number N2 of second-type writes. The sequence may be repeated over and over. The number N1 may equal the number N2. Alternately, the number N1 may be different from that of N2. The number N1 may be any whole number greater than 0. Likewise, the number N2 may be any whole number greater than 0.

In another embodiment, writing may be performed in the first direction for a period of time TIME1 and writing may be performed in the second direction for a period of time TIME2. This sequence may be repeated over and over. The time period TIME1 may be equal to time period TIME2 or the two time periods may be different.

As noted above, the phase-change memory element may be programmed in many different ways using different schemes. As noted above, the phase-change memory element may be operated in a binary mode. In this case, the memory element may be programmed back and forth between two different structural states. The first structural state may have a first resistance value and the second structural state may have a second resistance value.

As one example, the first structural may be the SET state of the memory element while the second structural state may be the RESET state of the memory element. When doing a first-type SET operation the voltage applied to the bitline may be V1BLSET while the voltage applied to the power line may be V1PLSET. When doing a first-type RESET operation the voltage applied to the bitline may be V1BLRESET while the voltage applied to the power line may be V1PLRESET. When doing a second-type SET operation the voltage applied to the bitline may be V2BLSET while the voltage applied to the power line may be V2PLSET. When doing a second-type RESET operation the voltage applied to the bitline may be V2BLRESET while the voltage applied to the power line may be V2PLSET. The voltages applied to the bitlines or to the power line may be any voltages sufficient to create the appropriate current amplitudes through the memory element (so as to SET or RESET the memory element) in the appropriate directions. This embodiment is summarized in the Table 1 below.

TABLE 1

|  | First-type SET | First-type RESET | Second-type SET | Second-type RESET |
| --- | --- | --- | --- | --- |
| Voltage applied to bitline | V1BLSET | V1BLRESET | V2BLSET | V2BLRESET |
| Voltage applied to power line | V1PLSET | V1PLRESET | V2PLSET | V2PLRESET |

In one embodiment of the invention, it may be assumed that for first-type writes the current flows from the bitline to the power line. In this example, the voltage at the bitline would be greater than the voltage at the power line and $$V1BLSET > V1PLSET \text{ and } V1BLRESET > V1PLRESET$$

Also, in one embodiment of the invention, it may be assumed that for second-type writes the current flows from the power line to the bitline so that the voltage at the power line should be greater than the voltage at the bitline and $$V2PLSET > V2BLSET \text{ and } V2PLRESET > V2BLRESET$$

In one or more embodiments of the invention, when programming is done back and forth between the SET and RESET states of the memory elements, it is preferable that the voltage across the phase-change memory element is greater than the voltage $V_{th}(M)$ which is the threshold voltage of the memory element in its RESET state. This may ensure that the memory element, if in its RESET state, will have a sufficient voltage across it so that it will conduct a current so that it can be programmed to its SET state. If this is the case, then we have the following conditions:

$$V1BLSET - V1PLSET > V_{th}(M) \text{ and}$$

$$V1BLRESET - V1PLRESET > V_{th}(M)$$

$$V2PLSET - V2BLSET > V_{th}(M) \text{ and}$$

$$V2PLRESET - V2BLRESET > V_{th}(M)$$

In one or more embodiments of the invention, the voltages may be chosen so that for both first-type SET and RESET, the voltage applied to the power line is the same voltage V1. Likewise, for second-type SET and RESET, the voltage applied to the power line may be the same voltage V2. This is shown in Table 2 below.

TABLE 2

|  | First-type SET | First-type RESET | Second-type SET | Second-type RESET |
| --- | --- | --- | --- | --- |
| Voltage applied to bitline | V1BLSET | V1BLRESET | V2BLSET | V2BLRESET |
| Voltage applied to power line | V1 | V1 | V2 | V2 |

In one or more embodiments of the invention, the voltages may be chosen so that for both first-type SET and RESET write operations, the voltage applied to the power line is the same voltage GROUND. Likewise, for second-type SET and RESET, the voltage applied to the power line may be the same voltage as the power supply voltage $V_{cc}$. This is shown in Table 3 below.

TABLE 3

|  | First-type SET | First-type RESET | Second-type SET | Second-type RESET |
| --- | --- | --- | --- | --- |
| Voltage applied to bitline | V1BLSET | V1BLRESET | V2BLSET | V2BLRESET |
| Voltage applied to power line | GROUND | GROUND | Vcc | Vcc |

It is noted that the voltages described above may be applied to those memory cells having memory elements that are actually being written to. For those memory cells having memory elements which are not being written to, the voltage at the bitline may be made to be identical with the voltage at the power line so that no current flows through the memory element regardless of the state of the isolation transistor $Q_I$.

In the embodiment described above, the memory element may be programmed back and forth between its SET and RESET states. However, as shown in FIG. 1, the memory element may also be programmed among two or more intermediate resistance states. For example, the memory element may be programmed back and forth between intermediate resistance states R1 and R2 shown in FIG. 1 to provide a binary mode of operation. As another example, the memory element may be programmed among the three states R1, R2 and R3 shown in FIG. 1 to provide a mode of operation with more that one bit of storage per cell. In another embodiment of the invention, the memory element may be programmed among more than three resistance states to provide a mode of operation with more than one bit of storage per cell.

Figure 3:
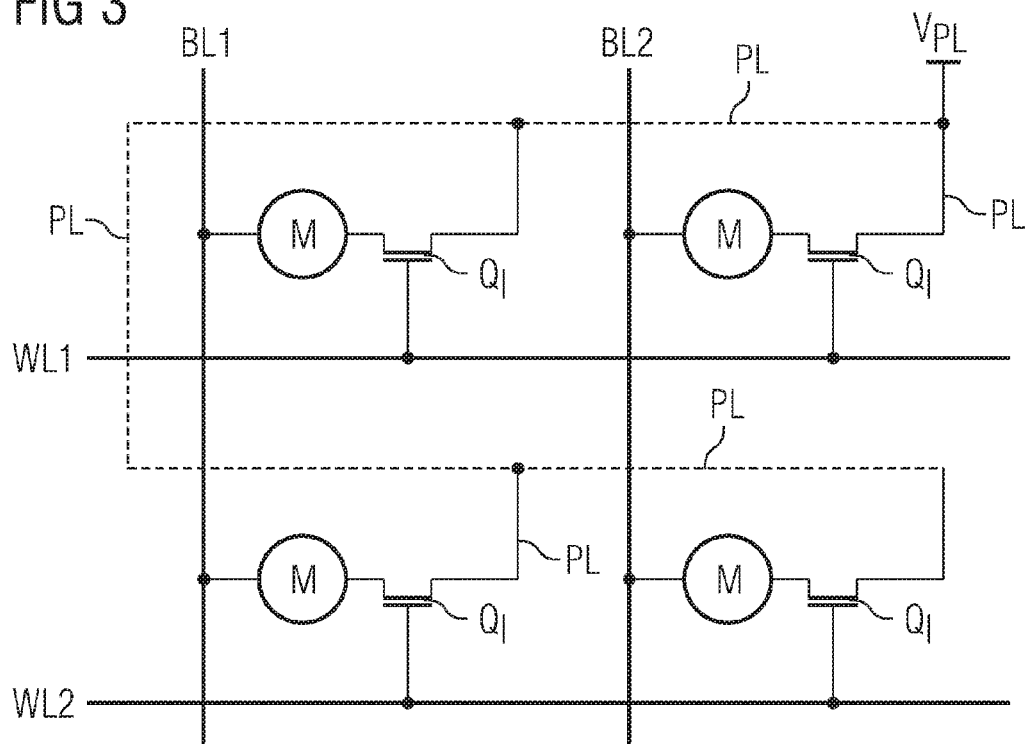
FIG. 3 is an embodiment of a memory array of the present invention.
Figure 4:
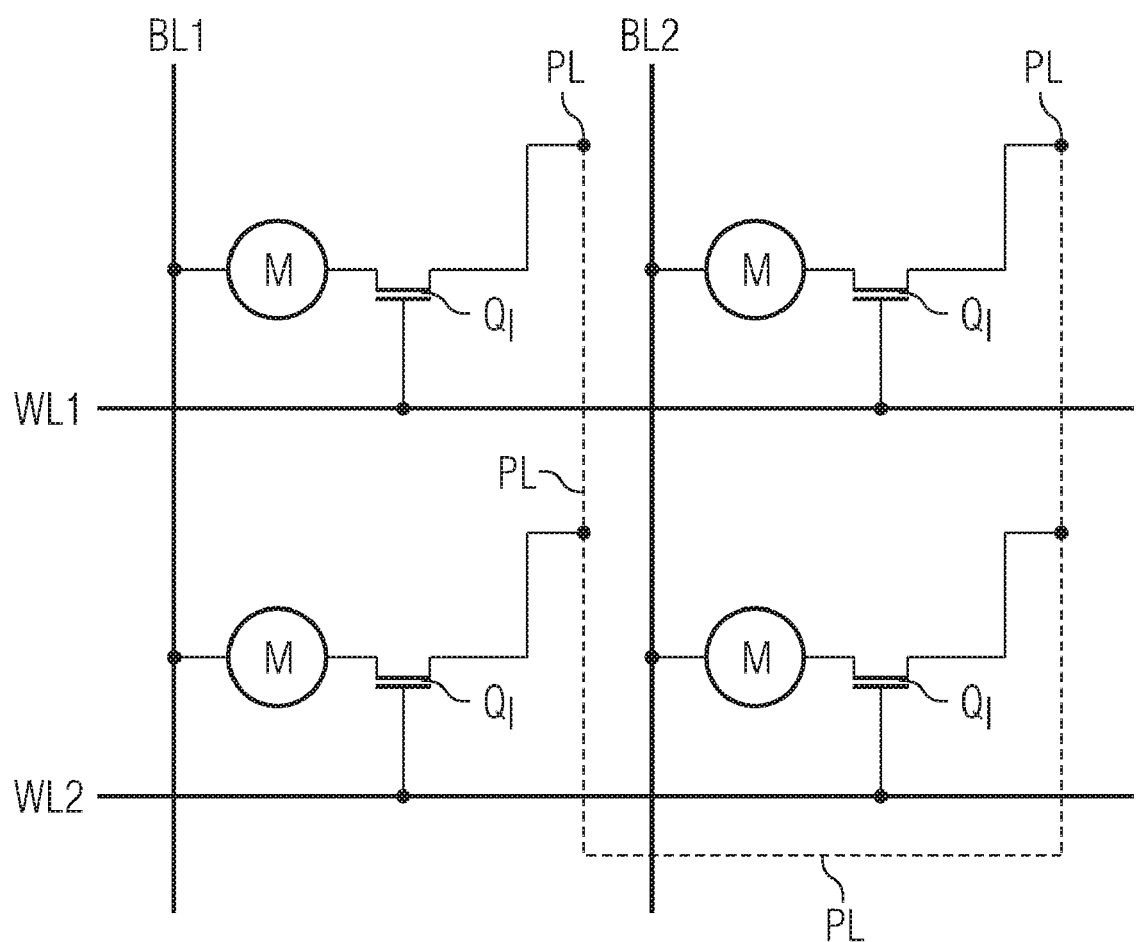
FIG. 4 is an embodiment of a memory array of the present invention.

In the embodiment shown in FIG. 2, the same power line PL is a common node to each of the isolation transistors $Q_I$. In this case, the same power line voltage $V_{PL}$ is applied to each of the transistors $Q_I$. The power line voltage $V_{PL}$ may be brought to each of the transistors $Q_I$ through physical lines which are oriented parallel to the wordlines. This embodiment is shown in FIG. 3 where the common node power line PL includes the dashed lines. In another embodiment of the invention, the isolation transistors $Q_I$ may be coupled to the power line voltage $V_{PL}$ through physical lines which are oriented parallel to the bitlines. This is shown in FIG. 4. In the embodiment shown in FIG. 4, the common node power line includes the dashed lines.

When an isolation transistor $Q_I$ is switched on, the corresponding phase-change element M is coupled to its respective power line. Hence, by switching on an entire row of isolation transistors $Q_I$, all of the corresponding phase-change elements M on the same row are coupled to the power line. If there is a potential difference between the power line voltage $V_{PL}$ and the voltage on one or more of bitlines, current will flow through the each of the corresponding memory elements where such a potential difference exists. Current flows through the current path of the isolation transistor $Q_I$ and through the phase-change element M. Hence, it is possible to write to a plurality of memory elements on a single row of the memory array at the same time.

Figure 5:
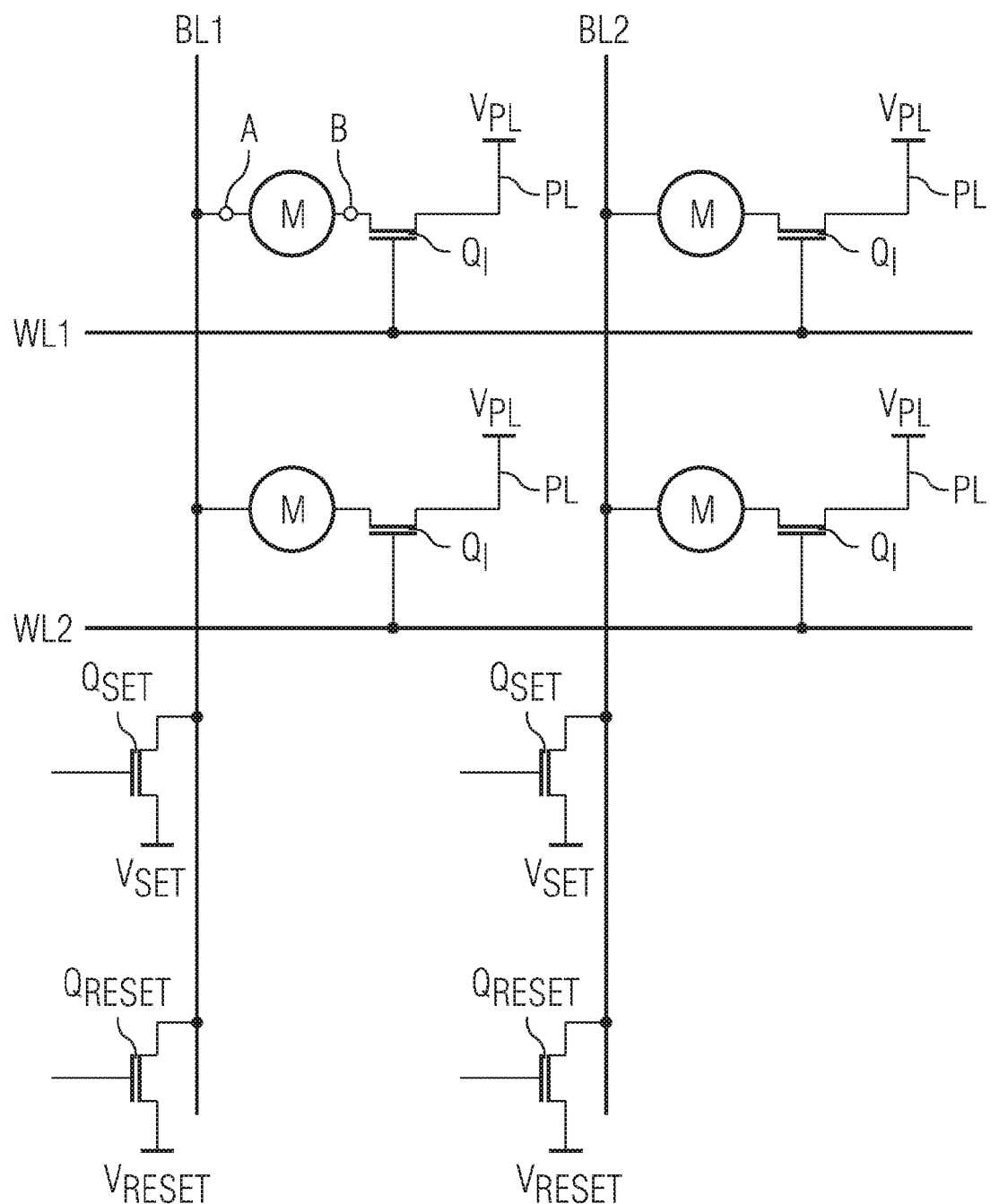
FIG. 5 is an embodiment of a memory array of the present invention.

A bi-direction write technique may also be applied using the embodiment of the memory array circuit shown in FIG. 5. In this example, the write operation makes use of two additional transistors coupled to each of the bitlines. One transistor $Q_{SET}$ may be turned on when the memory element is being programmed to its SET state and the other transistor $Q_{RESET}$ may be turned on when the memory element is being RESET. The voltages $V_{PL}$ and $V_{SET}$ may be adjusted to control the direction of current through the memory element during SET operations. Likewise, the voltages $V_{PL}$ and $V_{RESET}$ may be adjusted to control the direction of the current through the memory operation during RESET operations.

The levels and durations of the SET and RESET currents may be user adjustable over a wide range. In one or more embodiments of the invention, the amplitude of the SET current may be between about 50 uA to about 300 uA. In one or more embodiments of the invention, the duration of the SET current may be between about 10 nanoseconds to about 200 nanoseconds. In one or more embodiments of the invention, the amplitude of the RESET currents may be between about 90 uA to about 500 uA. In one or more embodiments of the invention, the amplitude of the RESET currents may be greater than the amplitude of the SET currents. In one or more embodiments of the invention, the duration of the RESET current may be less than the duration of the SET current.

Figure 6:
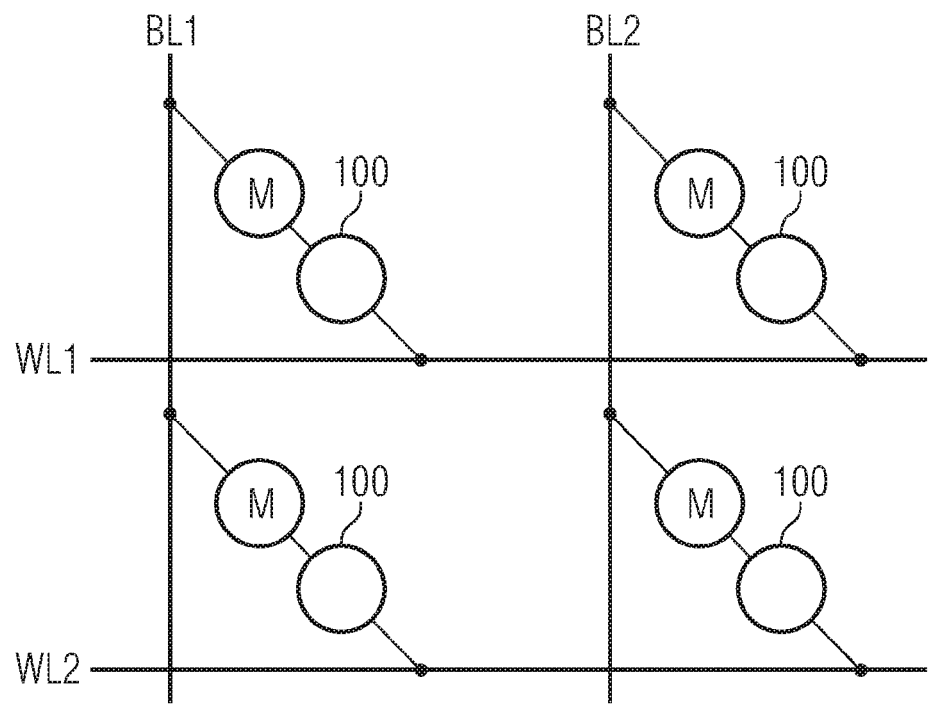
FIG. 6 is example of a memory array of the present invention.

A bi-direction write technique may also be applied to other embodiments of the phase-change memory array. For example, the two by two array shown in FIG. 6. In FIG. 6, each of the memory cells includes a phase-change memory element in series with an access device 100 between a bitline and a wordline. In this example, voltages applied to the bitlines and wordlines are controlled so that one or more write operations are first-type writes where the current through the memory element is in a first direction (such as from the bitline to the wordline) and one or more write operations are second-type writes where the current through the memory element is in a second direction (such as the opposite direction from a wordline to a bitline). Referring to the embodiment shown in FIG. 6, in one embodiment of the invention, first-type writes may be achieved by applying certain voltages to the bitlines and wordlines. Second-type writes may be achieved by flipping the application of the voltages (that is, by applying the previous bitline voltages to the wordlines and by applying the previous wordline voltages to the bitlines). In another embodiment of the invention, other ways of applying voltages to the bitlines and wordlines are possible. For example, it may be possible to keep the wordline voltages at some constant value while changing the bitline voltages to achieve first-type writes (which, for example, may be SET and RESET write operations) as well as second-type writes (which, for example, may be SET and RESET write operations).

Figure 7:
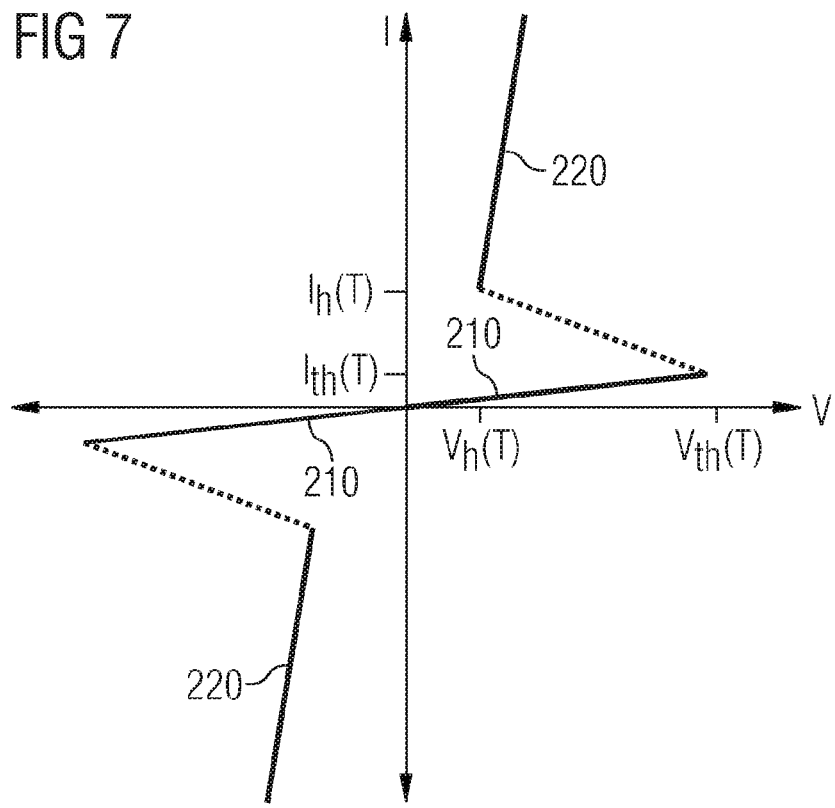
FIG. 7 is an example of the current-voltage characteristics of an embodiment of a chalcogenide threshold switch.

In one embodiment of the invention, the access device 100 may be a threshold switch. The threshold switch may be a chalcogenide threshold switch. The current-voltage (I-V) characteristics of an embodiment of a chalcogenide threshold switch is shown in FIG. 7. FIG. 7 shows the I-V characteristics of a chalcogenide threshold switch. The I-V plot in both the first quadrant (where voltages and currents are positive)

and the third quadrant (where voltages and currents are negative). While only the first quadrant is described below, an analogous description applies to the curve in the third quadrant of the I-V plot (where the voltage and the current are both negative). The threshold voltage of threshold switch is referred to as $V_{th}(T)$, the threshold current as $I_{th}(T)$, the holding voltage as $V_h(T)$, the holding current of the switch as $I_h(T)$.

The I-V characteristic curve IV includes an "off-state" branch 210 and an "on-state" branch 220. When the switch operates on the off-state branch, it is in its OFF state. When the switch operates on the on-state branch 220, the switch is in its ON state. The resistance of the switch is lower in its ON state than in its OFF state. The slopes of the off-state and on-state branches shown in FIG. 7 (and hence the resistances of the OFF and ON states, respectively) are illustrative and not intended to be limiting.

Referring to FIG. 7, when no voltage is applied across the switch, the switch is in the OFF state and no current flows. The threshold switch remains in its OFF state as the voltage across the threshold switch and the current through the threshold switch is increased, up to a voltage $V_{th}(T)$ which is referred to as the threshold voltage of the threshold switch. When the applied voltage across the threshold switch equals or exceeds the threshold voltage $V_{th}(T)$, the threshold switch switches from the off-state branch 210 to the on-state branch 220 of the I-V curve, the switch switches from its OFF state to its ON state. The threshold switching event is depicted by the dashed line in FIG. 7. Upon switching and depending upon the load impedance between the forced voltage and the threshold switch, the voltage across the threshold switch may decrease significantly and the current through the threshold switch may increase significantly. The voltage across the threshold switch may drop ("snapback") to a holding voltage $V_h(T)$ which is less than the threshold voltage $V_{th}(T)$. The difference between the threshold voltage $V_{th}(T)$ and the holding voltage $V_h(T)$ is referred to as the snapback voltage. The threshold switch remains in its ON state (on the on-state branch 220) as long as a minimum current, called the holding current $I_h(T)$, is maintained (the associated voltage $V_h(T)$ is referred to as the holding voltage). Regardless of how long the threshold switch was kept in its ON state, if the current through the switch drops below $I_h(T)$, the threshold switch returns to its OFF state. The threshold switch then requires re-application of a voltage across the switch greater than or equal to the threshold voltage $V_{th}(T)$ to resume operation on the on-state branch.

In one or more embodiments of the invention, the chalcogenide threshold switching material may be in an amorphous state and may remain in an amorphous state regardless of the energy applied. In one or more embodiments of the invention, a chalcogenide threshold switching material may not crystallize with application of energy. In one or more embodiments of the invention, a threshold switching material may not be a phase-change material. In one or more embodiments of the invention, a threshold switching material may not be a programmable material. The I-V characteristic curve shown in FIG. 7 is an example of an S-type I-V curve. Any threshold switch having this type of I-V curve may be used in the present invention. The threshold switching material need not be a chalcogenide material. The present invention may also be applicable to threshold switching materials which are not S-type materials.

Referring again to FIG. 7, analogous switching behavior occurs in the third quadrant of the I-V plot shown in FIG. 7. Provided one is aware of the negative polarities of both the voltage and current of the I-V curve in the third quadrant, the switching behavior in the third quadrant is analogous to that described hereinabove for the first quadrant. The I-V plot shown in FIG. 7 is an example of what is referred to herein as a "symmetric" I-V curve whereby the currents and voltages of the I-V curve in the half plane V<0 are equal in magnitude but in an opposite direction to the currents and voltage of the I-V curve in the half plane V>0.

Referring again to FIG. 6, in one or more embodiments of the invention, the access device 100 may be any access device having a symmetric current-voltage characteristic. In the embodiment shown, the access device 100 is a two terminal device, however, it is possible that the access device also be a three or more terminal access device. The three or more terminal access device may be electrically coupled in series between a bitline and a wordline.

The alternating sequence of one or more first-type writes followed by one or more second-type writes may be controlled by a write control circuit. Referring, to the embodiments shown in FIGS. 2, 3 and 4, the write control circuit may control the voltages on the power line and/or the voltages on the bitlines in order to control the direction of the current through the memory elements during the write operations. Likewise, referring to the embodiment shown in FIG. 5, the write control circuit may control the voltages $V_{SET}$, $V_{RESET}$ and $V_{PL}$ in order to control the direction of the current through the memory elements during the write operations. Likewise, referring to the embodiment shown in FIG. 6, the write control circuit may control the voltages on the bitlines BL1, BL2 and the wordlines WL1, WL2 in order to control the direction of the current through the memory elements during the write operations.

In one or more embodiments of the invention, the write control circuit may monitor the number of write operations that have been performed in a certain direction (e.g. the number of first-type writes or the number of second-type writes) through a particular memory element. For example, the write control circuit may monitor the number of first-type writes wherein current goes through the memory element in a first direction. After a certain number of first-type write have been performed, the write control circuit may change the voltages on the power line and the corresponding bitline so that additional write operations to the same memory element now occur in the opposite direction That is, they are now second-type writes. Once again, the write control circuit may now monitor the number of second-type writes in this new direction. After a certain number of second-type write have been performed, the write control circuit may again change the voltages on the power line and corresponding bitline so that the direction of the current through the memory element is changed back.

In one or more embodiments of the invention, the write control circuit may monitor the time in which writes have been performed in a first direction. Based upon the time, the write control circuit may change the voltages on the power line and corresponding bitline so that the write operations are subsequently performed in a second (e.g. opposite) direction.

In one or more embodiments of the invention, it is also possible that the write control circuit monitors the contents of the memory elements. In this case, the direction of the current through the memory element may be changed from a first direction to a second (e.g. opposite) direction based upon the contents of the memory element.

In one or more embodiments of the invention, it is also possible that the write control circuit causes the direction of the current through the memory element to switch on a random basis.

Figure 8:
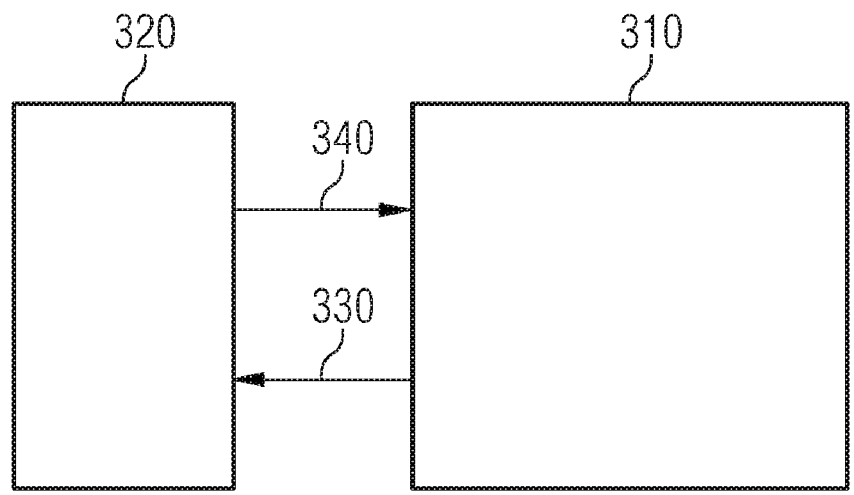
FIG. 8 is a block diagram of an embodiment of a memory system of the present invention.

FIG. 8 shows a block diagram of a memory system of the present invention. The memory system comprises a memory array 310 in electrical communication with a write control circuit 320. Information 330 about the memory array (for example, this may include the number of first-type writes, the number of second-type writes, to total time of the first-type writes, the total time of the second type writes, the contents of the memory elements of the array) is gathered by the write control circuit. Based upon the information 330 gathered by the write control circuit 320, the write control circuit 320 provides the voltages 340 to the memory array so that the memory array can do the appropriate type of write operation. The appropriate type of write operation may, for example, be a first-type write operation so that the current through the memory element is in a first direction or a second-type write operation so that the current through the memory element is in a second direction. As an example, the appropriate type of write operation may, for example, be a first-type SET, a first-type RESET, a second-type SET and a second-type RESET. The write circuit 320 may, for example and without limitation, be used in combination with any of the embodiments of the types of memory arrays shown in FIGS. 2 through 6.

Also disclosed herein is a bi-directional read scheme. During one or more read operations the current through the memory element may be directed in a first direction. Likewise, during one or more read operations the current through the memory element may be directed in a second direction (for example, opposite to the first direction). A first-type read may refer to a read operation wherein the current through the memory element is in a first-direction. A second-type read may refer to a read operation wherein the current through the memory element is in a second-direction (for example, opposite to the first direction). The bi-directional read scheme is applicable, for example and without limitation, to all of the embodiments of the memory arrays shown in FIGS. 2 through 6.

For example, referring to FIG. 2, when the memory element is being read, a voltage V1READ may be applied to the bitline and a voltage V2READ may be applied to the power line. In one or more embodiments of the invention, for read operations, the potential difference between the bitline and the power line may be less than the threshold voltage $V_{th}(M)$ of the memory element in its RESET state. This may be done to prevent the accidental programming of the memory element when the memory element is being read. After one or more read operations, it is possible that the read voltages applied to the bitline and power line are flipped so that the current direction through the memory element during the next one or more read operations is reversed.

Figure 9:
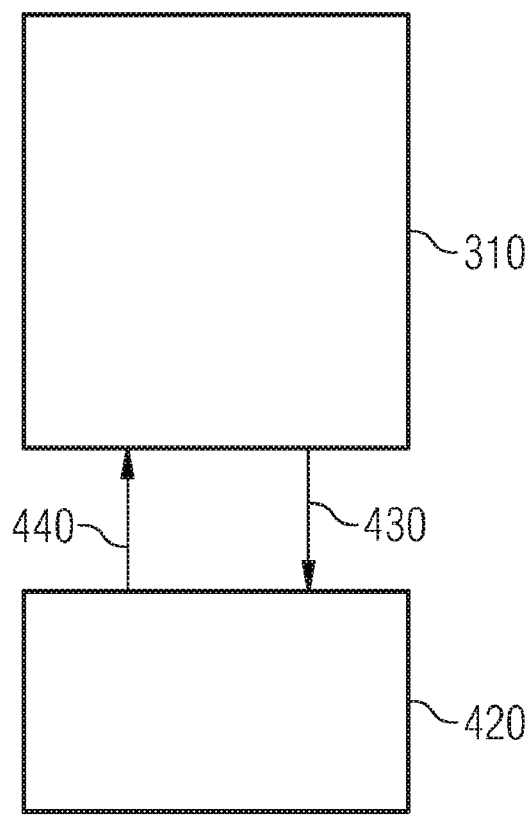
FIG. 9 is a block diagram of an embodiment of a memory system of the present invention.

FIG. 9 shows a block diagram of a memory system of the present invention. The memory system comprises a memory array 310 in electrical communication with a read control circuit 420. Information 430 about the memory array (for example, this may include the number of first-type read operations, the number of second-type read operations, the total time of the first-type read operations, the total time of the second type read operations, the contents of the memory elements of the array) is gathered by the read control circuit. Based upon the information 430 gathered by the read control circuit 420, the read control circuit 420 provides the voltages 440 to the memory array 310 so that the memory array can do the appropriate type of read operation. The appropriate type of read operation may, for example, be a first-type read or a second-type read. A first-type read may be a read wherein the current through the memory element is in a first direction. A second-type read may be a read operation wherein the current through the memory element is in a second direction. In one or more embodiments of the invention, the second direction is opposite to that of the first direction.

It is noted that, in one or more embodiments of the invention, it is possible that at least a portion of the write control circuit 320 shown in FIG. 8 and at least a portion of the read control circuit shown in FIG. 9 be combine as a common read/write control circuit. It is also possible that, in one or more embodiments of the invention, a bi-directional write scheme be combined with a bi-direction read scheme. In this case, one or more first-type writes or reads may be followed by one or more second-type writes or reads.

It is noted that when writing to and/or reading from a phase-change memory element it is possible that a certain amount of material transfer may occur between the phase-change material and the neighboring materials. For example, it is possible that, due to electromigration, a certain amount of material transfer may occur between the neighboring electrode materials and the memory material. It is possible, because of the change in direction of the current flow through the memory element, when writing to and/or reading from the memory element using one or more of the embodiments of the present invention, that the amount of such material transfer may be decreased.

As described above, the phase-change element of the memory system of the present invention is programmable to at least a first resistance state and a second resistance state. The memory element may be directly overwritable so that it can be programmed to a specific resistance state (for example, the first or the second resistance state) without the need to first be programmed to any starting state.

The phase-change material may be formed from a plurality of constituent atomic elements. For example, the phase-change material may include one or more elements selected from the group consisting of Te, Se, Ge, Sb, Bi, Pb, Sn, As, S, Si, P, O and mixtures or alloys thereof. In one or more embodiments of the invention, the phase-change material may include at least one chalcogen element. The at least one chalcogen element may be selected from the group consisting of Te, Se and mixtures or alloys thereof. The at least one chalcogen element may be a mixture of Te and Se. An example of the chalcogenide material which may be used is $Ge_2Sb_2Te_5$ An example of a phase-change memory material is a composition where the average concentration of Te is preferably less than about 70%, and more preferably between about 40% and about 60%. In one embodiment, the concentration of Ge in the material may be greater than about 5%. In another embodiment, the concentration of Ge may be between about 8% and about 50%. In another embodiment, the concentration of Ge may be between about 10% and about 44%. The remainder of the principal constituent elements may be Sb. The percentages given are atomic percentages which may total 100% of the atoms of the constituent elements. Thus, this composition may be characterized as $Te_aGe_bSb_{100-(a+b)}$. These ternary Ge—Sb—Te alloys may be useful starting materials for the development of additional phase-change materials having even better electrical characteristics.

In one or more embodiments of the invention, the phase-change material may include at least one transition metal element. The term "transition metal" as used herein includes elements 21 to 30, 39 to 48, 57 and 72 to 80. In one or more embodiments of the invention, the transition metal element may selected from the group consisting of Cr, Fe, Ni, Nb, Pd, Pt and mixtures or alloys thereof.

In one or more embodiments of the invention, the phase-change element may be formed from a phase-change material that is not a chalcogenide material. In yet other embodiments of the invention, it is also possible that devices be formed from programmable resistance materials that are not phase-change materials. For example, a programmable resistance material may be any material which is programmable between at least a first resistance state and a second resistance state. The programming means may, for example, be electrical energy (such as electrical current). However, other forms of energy, such as thermal energy and optical energy may also be used.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method of operating a phase-change memory array, comprising:
    providing said phase-change memory array, said phase-change memory array comprising a phase-change memory element in series with a three-terminal access device between a first address line and a power line, said power line being neither a bitline nor a wordline;
    causing a first current through said memory element from said first address line to said power line; and
    causing a second current through said memory element from said power line to said first address line,
wherein said causing said first current programs said memory element from a first resistance state to a second resistance state and said causing said second current programs said memory element from said first resistance state to said second resistance state.

2. The method of claim 1, wherein said causing said second current occurs before said causing said first current.

3. The method of claim 1, wherein said first address line is a bitline.

4. The method of claim 1, wherein said causing said first current includes applying a first voltage to said power line and said causing said second current includes applying a second voltage to said power line.

5. The method of claim 4, wherein said first voltage is a ground voltage and said second voltage is a power supply voltage.

6. The method of claim 1, wherein said access device is a transistor.

7. The method of claim 1, wherein said access device is a MOS transistor.

8. The method of claim 1, wherein said phase-change memory element comprises a chalcogenide material.

9. The method of claim 1, wherein said phase-change memory element is programmable to at least three resistance states.

10. The method of claim 1, wherein said causing said first current comprises applying a first voltage to said first address line and a second voltage to said power line, and wherein said causing said second current comprises applying a third voltage to said first address line and a fourth voltage to said power line.

11. The method of claim 10, wherein said second voltage is a ground voltage and said fourth voltage is a power supply voltage.

12. The method of claim 1, said causing said first current comprises applying a first voltage to said first address line and a second voltage to said power line, and wherein said causing said second current comprises applying said second voltage to said first address line and applying said first voltage to said power line.

13. The method of claim 1, wherein said causing said first current provides a first RESET operation and said causing said second current provides a second RESET operation.

14. The method of claim 1, wherein said causing said first current provides a first SET operation and said causing said second current a second SET operation.

15. The method of claim 1, wherein said causing said first current performs a write operation and said causing said second current operation.

16. The method of claim 1, wherein said first resistance state is a SET state and said second resistance state is a RESET state.

17. The method of claim 1, wherein said first resistance state is a RESET state and said second resistance state is a SET state.

18. The method of claim 1, wherein said first resistance state is a first intermediate state between said SET state and said RESET state and/or said second resistance state is a second intermediate state between said SET state and said RESET state.

* * * * *